(12) United States Patent
Wei et al.

(10) Patent No.: US 10,107,568 B2
(45) Date of Patent: Oct. 23, 2018

(54) BACK PLATE AND MOTHERBOARD HAVING THE SAME

(71) Applicant: COOLER MASTER TECHNOLOGY INC., New Taipei (TW)

(72) Inventors: Yu-Te Wei, New Taipei (TW); Ling She, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 0 days.

(21) Appl. No.: 15/640,559

(22) Filed: Jul. 2, 2017

(65) Prior Publication Data

US 2018/0180362 A1    Jun. 28, 2018

(30) Foreign Application Priority Data

Dec. 27, 2016  (CN) .................... 2016 2 1448878 U

(51) Int. Cl.
| | |
|---|---|
| *F28F 7/00* | (2006.01) |
| *F28F 9/007* | (2006.01) |
| *H01L 23/40* | (2006.01) |
| *H05K 1/02* | (2006.01) |

(52) U.S. Cl.
CPC ............ *F28F 9/0075* (2013.01); *H01L 23/40* (2013.01); *H05K 1/0203* (2013.01)

(58) Field of Classification Search
CPC ..... F28F 9/0075; H01R 4/5066; H01R 13/22; H01L 23/40; H01L 23/4006; H01L 23/4093; H05K 1/0203

USPC .......................................................... 165/76
See application file for complete search history.

(56) References Cited

U.S. PATENT DOCUMENTS

| | | | |
|---|---|---|---|
| 5,668,348 A * | 9/1997 | Lin ..................... | H01L 23/4093 174/16.3 |
| 6,082,440 A * | 7/2000 | Clemens ............. | H01L 23/4093 165/185 |
| 6,404,633 B1* | 6/2002 | Hsu ..................... | H01L 23/4006 24/458 |
| 2007/0243746 A1* | 10/2007 | Chiang ................. | H01R 13/22 439/331 |
| 2007/0254500 A1* | 11/2007 | Chiang ................ | H01R 4/5066 439/71 |

* cited by examiner

Primary Examiner — Davis Hwu
(74) Attorney, Agent, or Firm — Maschoff Brennan

(57) ABSTRACT

A back plate includes flat polygonal shaped body and locking assembly located at bottom surface of the flat polygonal shaped body. The locking assembly includes pivotal member, connecting member and protruding portion with connecting hole and locking hole. The connecting hole is located at a side of the locking hole. The locking hole is a curved hole with the connecting hole as a center. The pivotal member has hinge hole hinged with the connecting hole and a fixing hole matching with the locking hole, and the fixing hole is movable with respect to the locking hole with the hinge hole as a center. The connecting member is disposed through the fixing hole and the locking hole, and is connected to the seat. The connecting member is movable in the locking hole in order to make the fixing hole to move with respect to the locking hole.

10 Claims, 4 Drawing Sheets

BACK PLATE AND MOTHERBOARD HAVING THE SAME

CROSS-REFERENCE TO RELATED APPLICATIONS

This non-provisional application claims priority under 35 U.S.C. § 119(a) on Patent Application No(s). 201621448878.2 filed in China on Dec. 27, 2016, the entire contents of which are hereby incorporated by reference.

TECHNICAL FIELD

The disclosure relates to a back plate and a motherboard having the same, more particularly to a back plate adapted for different configurations of motherboards, and a motherboard having the back plate.

BACKGROUND

In the prior art, a back plate for a heat dissipator is a rectangular metal plate with threaded holes at its four corners. The threaded holes of the back plate correspond to the threaded holes of a motherboard, and can be fixed to each other with screws.

There is an improved back plate, which has multiple oval or gourd-shaped threaded holes at each corner, so it can fit different motherboards with different threaded hole arrangements. However, the producing cost of this type of back plate is high. In addition, the multiple threaded holes at each corner reduce the structural strength, and the oval or gourd-shaped holes have less stability while being connected. Furthermore, the screws are disposed through the threaded holes from the front side of the motherboard, but the back plate is disposed at the back side of the motherboard, so the sight of the assembler is blocked by the motherboard while aligning the threaded holes, which makes it difficult to assemble the back plate.

Moreover, there is a back plate assembly, which consists of two pieces of metal plates. The metal plates form in a cross shape, and each end of the metal plates has a long narrow opening for a locking member to slide over so that the back plate assembly is able to fit the motherboards with different threaded hole arrangements. However, the structural strength of the back plate assembly is low, so the back plate assembly is unable to bear large amounts of stress. The producing cost of this type of the back plate assembly is high as well.

SUMMARY

The present disclosure provides a back plate, which is able to fit different types of motherboards and easy to be installed, and a motherboard having the same.

One embodiment of the disclosure provides a back plate comprising a flat polygonal shaped body and a locking assembly located at a bottom surface of the flat polygonal shaped body. The locking assembly includes a protruding portion, a pivotal member and a connecting member. The protruding portion is located at a corner of the flat polygonal shaped body. A connecting hole and a locking hole are disposed on the protruding portion. The connecting hole is located at a side of the locking hole, and the locking hole is a curved hole with the connecting hole as a center. The pivotal member is disposed on the protruding portion. One end of the pivotal member has a hinge hole, and the hinge hole is hinged with the connecting hole. The other end of the pivotal member has a fixing hole matching the locking hole, and movable with respect to the locking hole with the hinge hole as a center. The connecting member is disposed through the fixing hole and the locking hole, and is adapted to be connected to a seat of the heat dissipater. The connecting member is movable in the locking hole in order to move the fixing hole with respect to the locking hole.

One embodiment of the disclosure provides a back plate comprising a flat polygonal shaped body and a locking assembly located at a bottom surface of the flat polygonal shaped body. The locking assembly includes a protruding portion, a pivotal member and a connecting member. The protruding portion is located at a corner of the flat polygonal shaped body, and is in one piece. A connecting hole and a locking hole are disposed on the protruding portion. The connecting hole is located at a side of the locking hole, and the locking hole is a curved hole with the connecting hole as a center. The pivotal member is a sheet-like object, and is attached to a surface of the protruding portion. The pivotal member and the protruding portion have the same shape, and an area of a top surface of the pivotal member is smaller than an area of a top surface of the protruding portion. One end of the pivotal member has a hinge hole, and the hinge hole is hinged with the connecting hole. The other end of the pivotal member has a fixing hole matching the locking hole. The fixing hole is movable with respect to the locking hole with the hinge hole as a center. The connecting member is disposed through the fixing hole and the locking hole, and is adapted to be connected to a seat of the heat dissipater. The connecting member is movable in the locking hole in order to move the fixing hole with respect to the locking hole One embodiment of the disclosure provides a motherboard. The motherboard comprises a top surface and a bottom surface. A seat of a heat dissipater is disposed on the top surface of the top surface. A back plate adapted for the heat dissipater is disposed on the bottom surface of the motherboard, wherein the back plate is the back plate described above. A top surface of the back plate is attached to the bottom surface of the motherboard.

According to the back plate of the embodiment of the disclosure, the connecting member is movable along the curved locking hole by moving the pivotal member. Therefore, the connecting member is able to be moved to be aligned with the threaded holes at different positions, such that the back plate of the disclosure is able to fit motherboards with different threaded hole arrangements.

Moreover, the back plate of the disclosure is disposed at the back side of the motherboard, so the sight of the assembler will not be blocked during assembling, and it is easy to align the holes. Thus, the working efficiency is raised.

BRIEF DESCRIPTION OF THE DRAWINGS

The present disclosure will become more fully understood from the detailed description given here in below and the accompanying drawings which are given by way of illustration only and thus are not intending to limit the present disclosure and wherein.

DETAILED DESCRIPTION

Figure 1:
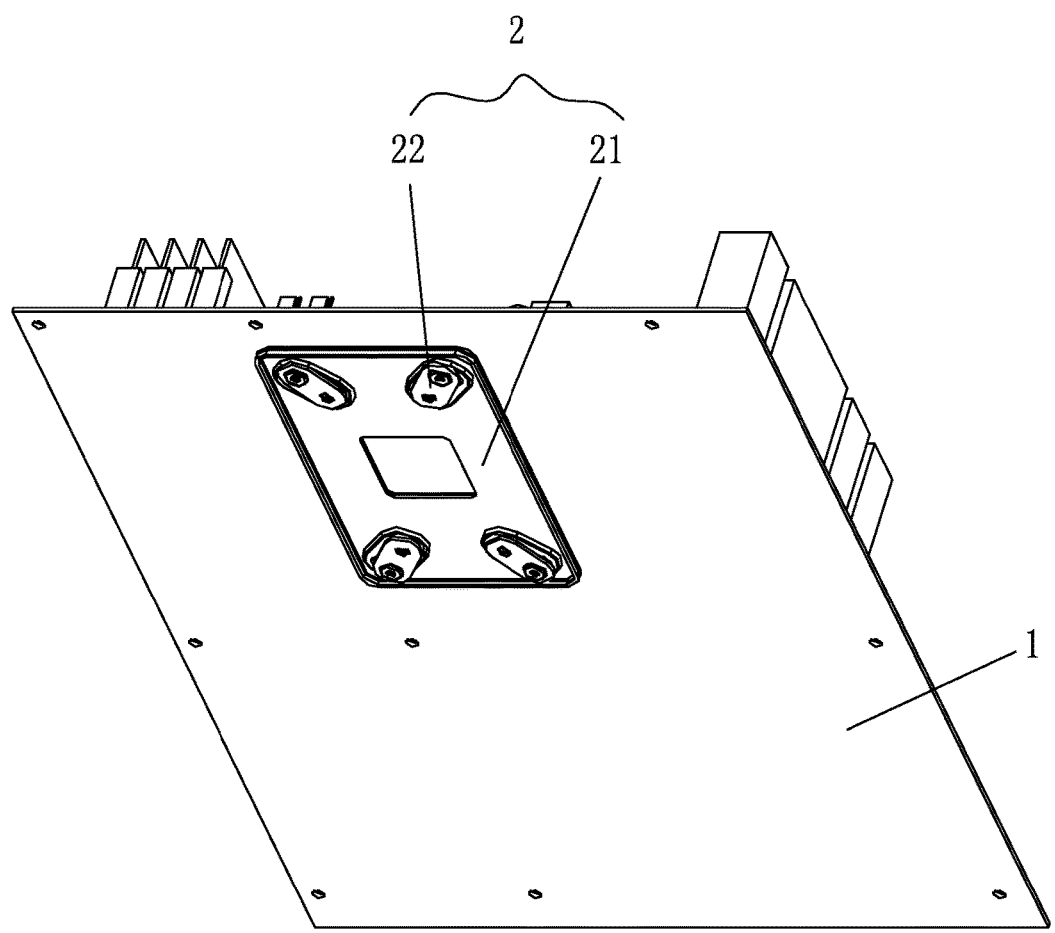
FIG. 1 is a perspective view of a motherboard in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
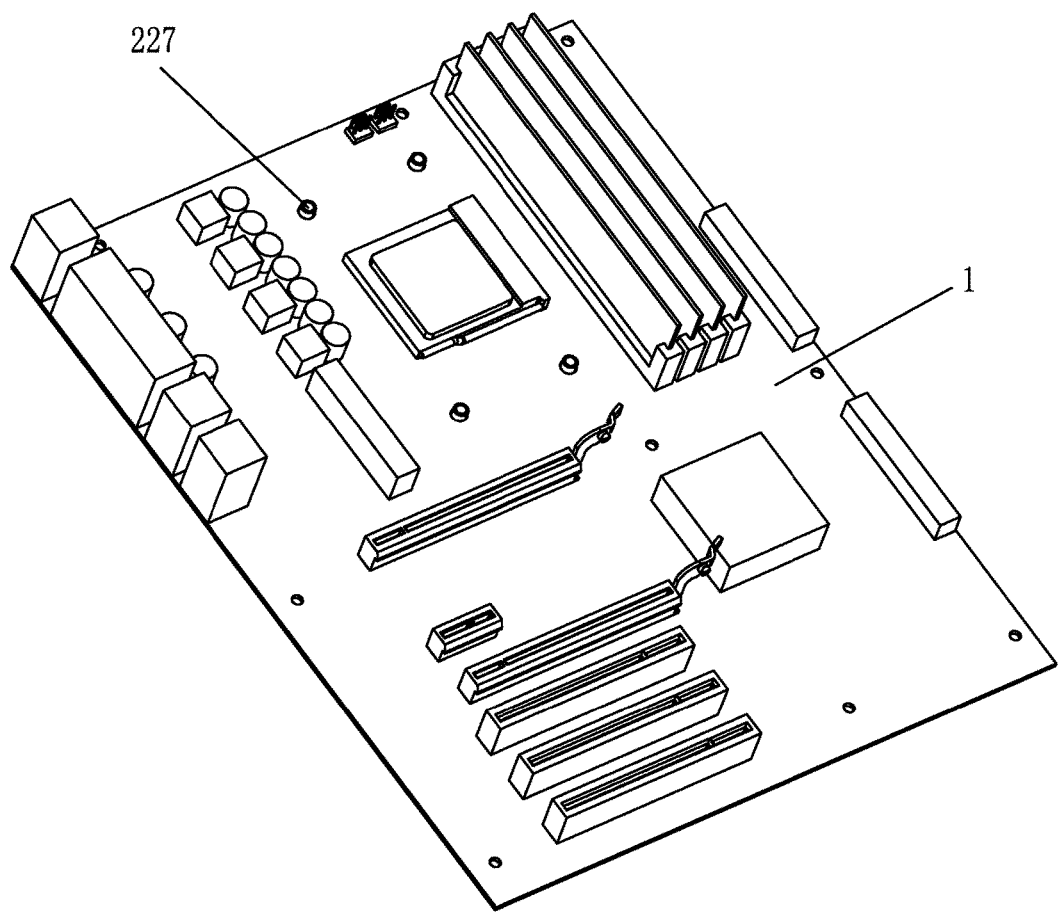
FIG. 2 is another perspective view of the motherboard in FIG. 1.

Please refer to FIG. 1 and FIG. 2. FIG. 1 is a perspective view of a motherboard in accordance with one embodiment of the disclosure. FIG. 2 is another perspective view of the motherboard in FIG. 1. This embodiment provides a motherboard 1. For the purpose of illustrating less complicated, the descriptions of electrical components on the motherboard 1 will not be described. In this embodiment, the front side of the motherboard 1 has a seat (not shown) for a heat dissipater to dispose. In addition, the embodiment further provides a back plate 2, which is a so-called reinforcement plate. The back plate 2 is disposed at the back side of the motherboard 1 with its top surface. Moreover, there is a connecting member 227 disposed through the motherboard 1 to be connected to the seat. The detail of the back plate 2 is described in the following paragraphs.

Figure 3:
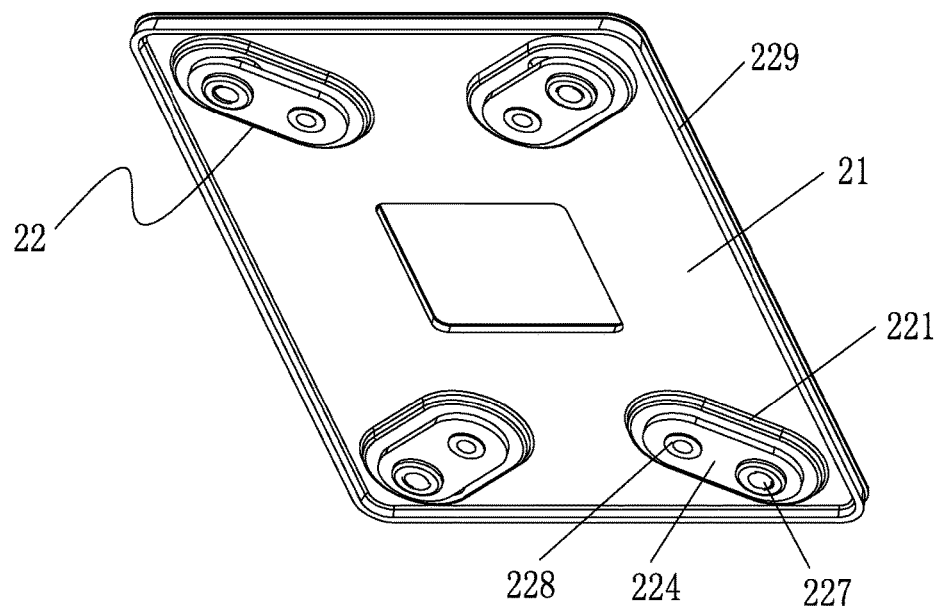
FIG. 3 is a perspective view of a back plate in the motherboard in FIG. 1.
Figure 4:
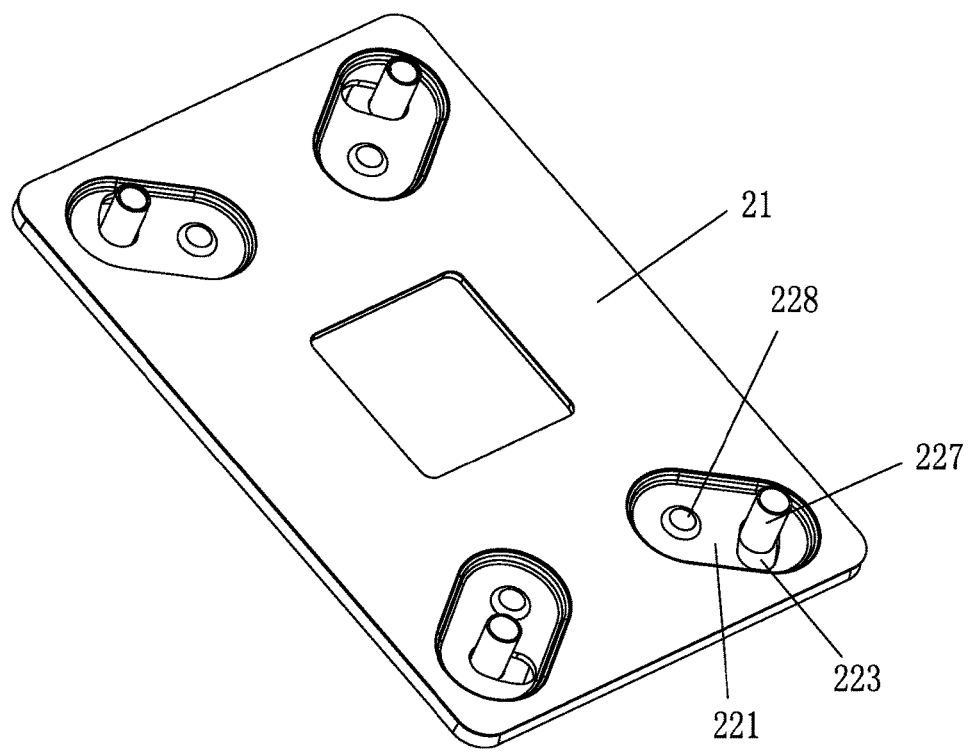
FIG. 4 is another perspective view of the back plate in FIG. 3.
Figure 5:
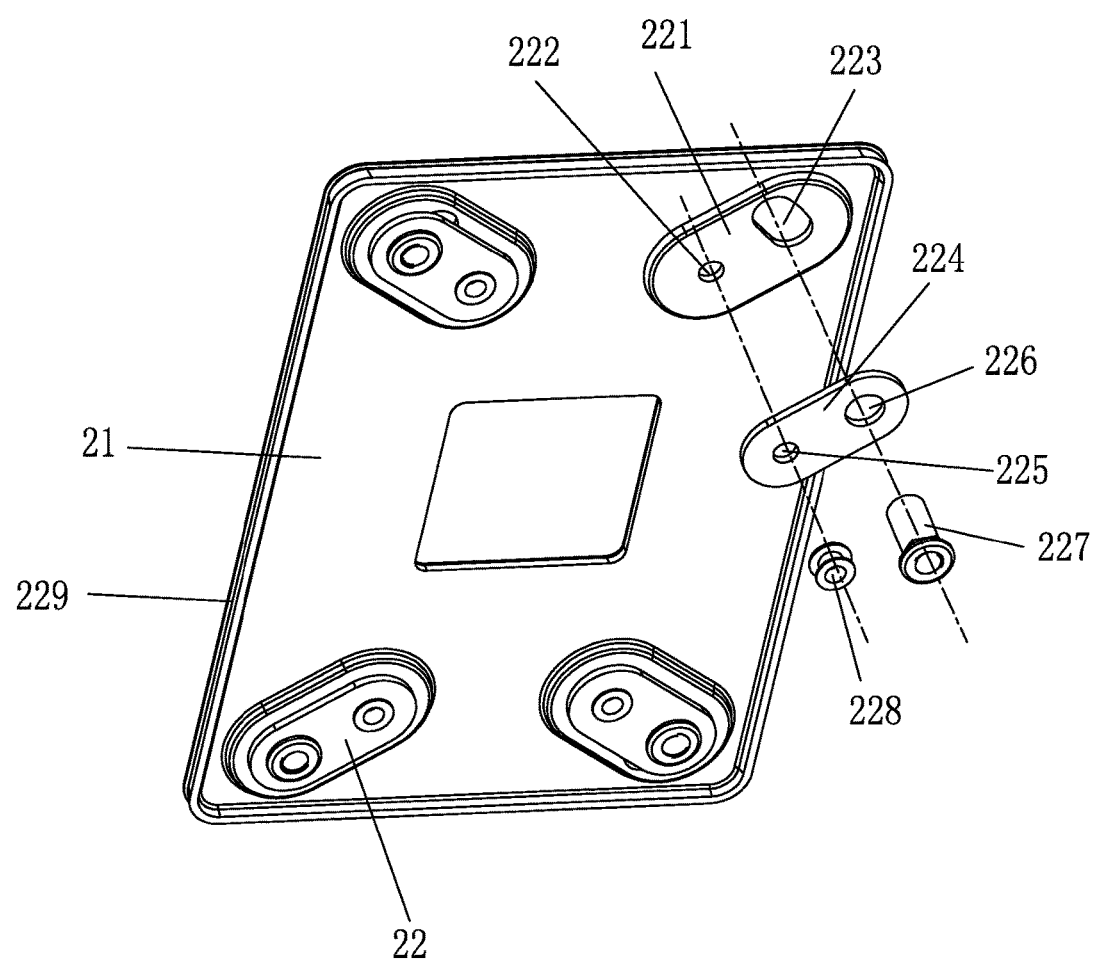
FIG. 5 is a partial exploded view of the back plate in FIG. 3.

Please refer to FIG. 3 to FIG. 5. FIG. 3 is a perspective view of a back plate in the motherboard in FIG. 1. FIG. 4 is another perspective view of the back plate in FIG. 3. FIG. 5 is a partial exploded view of the back plate in FIG. 3. In this embodiment, the main portion of the back plate 2 is a flat polygonal shaped body 21, and the flat polygonal shaped body 21 is, for example, a metal plate with two opposite surfaces. The shape of the flat polygonal shaped body 21 can be changed according to the shape of the heat dissipater. Usually, the seat is fixed to a heat dissipater at four corners, so the shape of the flat polygonal shaped body 21 is, for example, rectangular in this embodiment. The back plate 2 includes four locking assemblies 22 at the bottom surface of the flat polygonal shaped body 21. Each locking assembly 22 includes a protruding portion 221, a pivotal member 224, and a connecting member 227.

In this embodiment, the protruding portions 221 are respectively located at the corners of the flat polygonal shaped body 21. Each protruding portion 221 has a connecting hole 222 and a locking hole 223. The connecting hole 222 is located at a side of the locking hole 223, and the locking hole 223 is a curved hole with the connecting hole 222 as a center. The radian of the locking hole is, for example, 20 degrees. A center of the connecting hole 222 and a center of the locking hole 223 are on the same line, and the line has an angle of 45 degrees with respect to a horizontal line. The said horizontal line is, for example, a line that is parallel to a symmetrical line of the flat polygonal shaped body 21. In this embodiment, the shape of the flat polygonal shaped body 21 is rectangular, so the four protruding portions 221 are respectively disposed at four corners of the flat polygonal shaped body 21. The protruding portions are arranged in a line symmetric manner or axially symmetric manner, that is the four protruding portions 221 are arranged symmetrically with respect to the symmetrical line of the flat polygonal shaped body 21. In other words, the four protruding portions 221 are disposed symmetrically with respect to the center of the flat polygonal shaped body 21. In addition, the protruding portions 221 and the flat polygonal shaped body 21 are, for example, formed in one piece.

The pivotal members 224 are respectively disposed on the protruding portions 221. Each pivotal member 224 is a sheet-like object. One end of the pivotal member 224 has a hinge hole 225, and the hinge hole 225 is hinged with the connecting hole 222 by, for example, a rivet 228. The other end of the pivotal member 224 has a fixing hole 226 matching the locking hole 223. The fixing hole 226 is movable with respect to the locking hole 223 with the hinge hole 225 as a center. In this embodiment, the pivotal member 224 and the protruding portion 221 have the same shape, but an area of a top surface of the pivotal member 224 is smaller than an area of a top surface of the protruding portion 221. Both the shapes of the pivotal member 224 and the protruding portion 221 can be, for example, oval or obround, and the present disclosure is not limited thereto. In this embodiment, the back plate 2 includes a flange 229 disposed on an edge of the bottom surface of the flat polygonal shaped body 21. The pivotal member 224 is attached to the bottom surface of the protruding portion 221, and the distance between the pivotal member 224 and the bottom surface of the flat polygonal shaped body 21 is slightly larger or equal to the height of the flange 229 protruding from the bottom surface of the flat polygonal shaped body 21.

The connecting member 227 is disposed through the fixing hole 226 and the locking hole 223 so as to be connected to the heat dissipator. The connecting member 227 is movable in the locking hole 223 so that the connecting member 227 is able to move the fixing hole 226 with respect to the locking hole 223. In other words, the connecting member 227 is able to move the fixing hole 226 within the locking hole 223. In this embodiment, the connecting member 227 is a screw, but the present disclosure is not limited thereto.

According to the motherboard and the back plate in above embodiments, the connecting member is movable along the curved locking hole by moving the pivotal member. Therefore, the connecting member is able to be moved to be aligned with the threaded holes at different positions, such that the back plate of the disclosure is able to fit motherboards with different threaded hole arrangements.

Furthermore, the back plate of the disclosure is disposed at the back side of the motherboard, so the sight of the assembler will not be blocked during assembling, and it is easy to align the holes. Thus, the working efficiency is raised.

Moreover, because the distance between the pivotal member and the bottom surface of the flat polygonal shaped body is slightly larger or equal to the height of the flange protruding from the bottom surface of the flat polygonal shaped body, and there is a distance between the pivotal member and the fringe of the flat polygonal shaped body, such that the pivotal members will not stick out the flange of the back plate. The flange on the flat polygonal shaped body is able to strengthen the structural strength of the back plate, making it not easy to deform.

What is claimed is:

1. A back plate adapted for a heat dissipator, the back plate comprising:
   a flat polygonal shaped body; and
   a locking assembly, located at a bottom surface of the flat polygonal shaped body, and the locking assembly comprising:
      a protruding portion, located at a corner of the flat polygonal shaped body, the protruding portion having a connecting hole and a locking hole, the connecting hole located at a side of the locking hole, and the locking hole being a curved hole with the connecting hole as a center;

a pivotal member, disposed on the protruding portion, one end of the pivotal member having a hinge hole, the hinge hole hinged with the connecting hole, another end of the pivotal member having a fixing hole matching the locking hole, and the fixing hole movable with respect to the locking hole with the hinge hole as a center; and a connecting member, disposed through the fixing hole and the locking hole, and adapted to be connected to a seat of the heat dissipator, and the connecting member movable in the locking hole in order to move the fixing hole with respect to the locking hole.

2. The back plate according to claim 1, wherein the flat polygonal shaped body comprises a flange disposed on an edge of the bottom surface thereof, a distance between the pivotal member and the bottom surface of the flat polygonal shaped body is slightly larger or equal to a height of the flange protruding from the bottom surface of the flat polygonal shaped body.

3. The back plate according to claim 1, wherein the flat polygonal shaped body is rectangular, and four corners of the flat polygonal shaped body each have the protruding portion.

4. The back plate according to claim 3, wherein the protruding portions and the flat polygonal shaped body are formed in one piece, and the protruding portions are arranged in a line symmetric manner or axially symmetric manner.

5. The back plate according to claim 3, wherein the pivotal member and the protruding portion have the same shape, and an area of a top surface of the pivotal member is smaller than an area of a top surface of the protruding portion.

6. The back plate according to claim 3, wherein a center of the connecting hole and a center of the locking hole are located on a line, and the line has an angle of 45 degrees with respect to a horizontal line.

7. The back plate according to claim 3, wherein the radian of the locking hole is 20 degrees.

8. The back plate according to claim 3, wherein the pivotal member and the protruding portion are fixed to each other through a rivet.

9. The back plate according to claim 3, wherein the connecting member is a screw.

10. A back plate adapted for a heat dissipator, the back plate comprising:

a flat polygonal shaped body; and a locking assembly, located at a bottom surface of the flat polygonal shaped body, and the locking assembly comprising:

a protruding portion, located at a corner of the flat polygonal shaped body, the protruding portion and the flat polygonal shaped body formed in one piece, the protruding portion having a connecting hole and a locking hole, the connecting hole located at a side of the locking hole, and the locking hole being a curved hole with the connecting hole as a center;

a pivotal member, being a sheet-like object, the pivotal member being attached to a surface of the protruding portion, the pivotal member and the protruding portion having the same shape, an area of a top surface of the pivotal member is smaller than an area of a top surface of the protruding portion, one end of the pivotal member having a hinge hole, the hinge hole hinged with the connecting hole, another end of the pivotal member having a fixing hole matching the locking hole, and the fixing hole movable with respect to the locking hole with the hinge hole as a center; and a connecting member, disposed through the fixing hole and the locking hole, and adapted to be connected to a seat of the heat dissipator, and the connecting member movable in the locking hole in order to move the fixing hole with respect to the locking hole.

* * * * *